United States Patent
Kim

(10) Patent No.: US 9,930,815 B2
(45) Date of Patent: Mar. 27, 2018

(54) MULTI-LAYER PCB HAVING FUNCTION OF DISSIPATING HEAT FROM POWER SEMICONDUCTOR MODULE PACKAGE AND PCB, AND PRODUCTION METHOD THEREOF

(71) Applicant: MDM Inc., Incheon (KR)

(72) Inventor: Ku Yong Kim, Incheon (KR)

(73) Assignee: MDM Inc., Incheon (KR)

( * ) Notice: Subject to any disclaimer, the term of this patent is extended or adjusted under 35 U.S.C. 154(b) by 0 days.

(21) Appl. No.: 15/358,687

(22) Filed: Nov. 22, 2016

(65) Prior Publication Data

US 2017/0208704 A1 Jul. 20, 2017

(30) Foreign Application Priority Data

Jan. 14, 2016 (KR) .................. 10-2016-0004720

(51) Int. Cl.
*H05K 7/20* (2006.01)
*H05K 1/02* (2006.01)
(Continued)

(52) U.S. Cl.
CPC ........... *H05K 7/209* (2013.01); *H05K 1/0204* (2013.01); *H05K 1/0207* (2013.01);
(Continued)

(58) Field of Classification Search
CPC ........ H01K 1/112; H01K 1/116; H01K 1/144; H01K 3/0058; H01K 3/0061;
(Continued)

(56) References Cited

U.S. PATENT DOCUMENTS 5,982,630 A * 11/1999 Bhatia .................. H05K 1/0207
216/20
6,201,300 B1 * 3/2001 Tseng ...................... H01L 23/36
174/16.3
(Continued)

FOREIGN PATENT DOCUMENTS

KR 10-2012-0033039 4/2012 ............... H05K 7/20
KR 10-2014-0013611 2/2014 ............... H05K 7/20

*Primary Examiner* — Dion R Ferguson
*Assistant Examiner* — Amir Jalali
(74) *Attorney, Agent, or Firm* — Harness, Dickey & Pierce, P.L.C.

(57) ABSTRACT

The present disclosure relates to a layered structure of a multi-layer PCB, and more particularly, to a structure of a high-power multi-layer PCB which can use a high current by efficiently dissipating heat generated from the inside of the multi-layered PCB and heat generated from a power semiconductor module package mounted on the PCB, and a production method thereof. The multi-layer PCB includes: a conductive plate having a plurality of heat poles protruding from at least one of a top surface and a bottom surface thereof; PCBs which are disposed on the top surface and the bottom surface of the conductive plate, and have a plurality of penetrating holes formed therethrough to allow the heat poles of the conductive plate to be inserted thereinto; and an insulation layer which is attached between the conductive plate and the PCBs in order to electrically insulate.

11 Claims, 6 Drawing Sheets

(51) Int. Cl.
*H05K 1/18* (2006.01)
*H05K 3/30* (2006.01)
*H05K 3/46* (2006.01)

(52) U.S. Cl.
CPC ........... *H05K 1/0263* (2013.01); *H05K 1/181* (2013.01); *H05K 3/303* (2013.01); *H05K 3/4608* (2013.01); *H05K 2201/10242* (2013.01)

(58) Field of Classification Search
CPC .......... H01K 3/4626; H01K 7/04; H01K 7/06; H05K 1/0201–1/0212; H05K 1/0298; H05K 1/115; H05K 1/181; H05K 3/0094; H05K 3/303; H05K 3/429; H05K 3/4608; H05K 2201/10242
USPC .................................. 361/721, 711; 174/252
See application file for complete search history.

(56) References Cited

U.S. PATENT DOCUMENTS

| | | | |
|---|---|---|---|
| 6,625,028 B1* | 9/2003 | Dove | H01L 23/13 165/185 |
| 2009/0154513 A1* | 6/2009 | Shin | H05K 1/0206 372/36 |
| 2011/0104856 A1* | 5/2011 | Lin | H05K 1/0204 438/118 |
| 2013/0118782 A1 | 5/2013 | Cho et al. | 174/252 |
| 2013/0148314 A1* | 6/2013 | Hirai | H05K 7/06 361/748 |
| 2015/0223317 A1* | 8/2015 | Oi | H01L 23/3735 361/709 |
| 2016/0133911 A1* | 5/2016 | Kim | H01M 10/425 361/93.1 |
| 2016/0212862 A1* | 7/2016 | Rathburn | C23C 18/1653 |

\* cited by examiner

MULTI-LAYER PCB HAVING FUNCTION OF DISSIPATING HEAT FROM POWER SEMICONDUCTOR MODULE PACKAGE AND PCB, AND PRODUCTION METHOD THEREOF

The present invention was supported by National Research and Development Project Business of the Ministry of Science, ICT and Future Planning, as follows:
[National Research and Development Project Business supporting the present invention]
[Project Identification Number] B0132-15-1006
[Related Department] Ministry of Science, ICT and Future Planning
[Research Management Specialized Agency] Institute for Information & Communications Technology Promotion (IITP)
[Research Business Name] Research and Development Supporting Project of Electronics and Telecommunications Research Institute
[Research Project Title] High-Efficiency GaN-based Key Components and Module Development for Base Station/Terminal Device

CROSS-REFERENCE TO RELATED PATENT APPLICATION

This application claims priority from Korean Patent Application No. 10-2016-0004720, filed on Jan. 14, 2016 in the Korean Intellectual Property Office, the disclosure of which is incorporated herein by reference in its entirety.

FIELD

Apparatuses and methods consistent with the exemplary embodiments relate to a layered structure of a multi-layer printed circuit board (PCB), and more particularly, to a structure of a high-power multi-layer PCB which can use a high current by efficiently dissipating heat generated from the inside of the multi-layered PCB and heat generated from a power semiconductor module package mounted on the PCB, and a production method thereof.

BACKGROUND

In a normal structure of a multi-layer PCB on which a power semiconductor module package is mounted, a plurality of PCBs 1 are stacked one on another as shown in FIG. 1. Each of the PCBs 1 is formed by printing circuit patterns 1b and 1c, made of copper, on both surfaces of a substrate 1a like FR-4, CEM-1, CEM-3, Al METAL-PCB. In addition, the PCBs are electrically insulated from one another by an insulation layer 2 which is made of prepreg and formed between the PCBs.

A power semiconductor module package P may be mounted on the circuit pattern of the outermost PCB 1. In order to discharge heat generated from the power semiconductor module package P, the core C of the power semiconductor module package P is disposed to face the outside (opposite to the PCB 1), and a heat dissipation structure 4 is installed on the outside of the power semiconductor module package P in contact with the core C.

According to such a normal multi-layer PCB structure, however, heat increases as the density of a current flowing through the circuit pattern increases. However, since the PCBs are stacked one on another in sequence, heat generated from the circuit pattern of the PCB located inside is not efficiently discharged and thus there is a great risk of fire. Accordingly, there is a disadvantage that it is impossible to use a high current of about hundreds of amperes to thousands of amperes.

In addition, in order to discharge the heat generated from the power semiconductor module package, the heat dissipation structure 4 should be additionally installed on the outside of the power semiconductor module package as shown in FIG. 1. However, there are disadvantages that the structure of a product becomes complicated due to the heat dissipation structure 4 and it is difficult to realize slimness and high density of a product due to the volume of the heat dissipation structure 4.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide a multi-layer PCB which can directly cool and discharge heat which his generated from a PCB disposed inside the layer and heat which is generated from a power semiconductor module package, simultaneously, and also, can use a high current and realize slimness and high density of a product by integrating a PCB and a heat dissipation structure, and a production method thereof.

According to an aspect of an exemplary embodiment, there is provided a multi-layer PCB on which a power semiconductor module package is mounted, the multi-layer PCB including: a conductive plate having a plurality of heat poles protruding from at least one of a top surface and a bottom surface thereof; PCBs which are disposed on the top surface and the bottom surface of the conductive plate 10, and have a plurality of penetrating holes formed therethrough to allow the heat poles of the conductive plate to be inserted thereinto; and an insulation layer which is attached between the conductive plate and the PCBs in order to electrically insulate.

Some of the plurality of heat poles may be in contact with the power semiconductor module package mounted on the PCBs to absorb heat generated from the power semiconductor module package, and some other heat poles are exposed to the outside of the PCBs to discharge heat to the outside.

In addition, the heat poles in contact with the power semiconductor module package P may be formed to have height corresponding to height of a bottom surface of the power semiconductor module package, and the heat poles exposed to the outside may extend to have height corresponding to height of an upper portion of the power semiconductor module package.

The conductive plate may be a thermally conductive plate which is made of a material selected from the group consisting of copper (Cu), aluminum (Al), silicon carbide (SiC), and aluminum nitride (AlN).

Each of the PCBs may be a double-sided PCB including a substrate and circuit patterns formed on both surfaces of the substrate. In addition, the PCBs may be formed by stacking a plurality of PCBs, and, in this case, an insulation layer may be interposed between the plurality of PCBs to electrically insulate.

The conductive plate 10 may be divided into an upper plate having the heat poles formed on a top surface thereof, and a lower plate having the heat poles formed on a bottom surface thereof, and an insulation layer may be attached between the upper plate and the lower plate.

According to an aspect of another exemplary embodiment, there is provided a method for producing a multi-layer PCB, the method including: a first step of preparing a conductive plate having a plurality of heat poles protruding from a top surface and a bottom surface thereof; a second step of attaching an insulation layer to outer surfaces of the conductive plate 10; a third step of attaching PCBs to the top surface and the bottom surface of the conductive plate, respectively, and placing the PCBs to allow the heat poles of the conductive plate to be inserted into penetrating holes formed on the PCBs; and a fourth step of removing the insulation layer from the outer surfaces of the heat poles inserted through the PCBs and exposed to the outside of the PCBs by etching.

Next, a power semiconductor module package may be mounted on the PCBs and may be placed to have a core of the power semiconductor module package brought into contact with some of the heat poles, and some other heat poles may be exposed to the outside.

The first step may include individually producing and preparing an upper plate having the heat poles formed on a top surface thereof, and a lower plate having the heat poles formed on a bottom surface thereof, attaching a second insulation layer between the upper plate and the lower plate, and combining the upper plate and the lower plate with each other.

The second step may include exposing both right and left side surfaces of the conductive plate to the outside without attaching the insulation layer to both the right and left side surfaces of the conductive plate, for the sake of heat dissipation.

According to the present disclosure described above, the conductive plate which is capable of transmitting heat is disposed between the upper and lower PCBs, the heat poles protrude from the top surface and the bottom surface of the conductive plate, and then some of the heat poles are brought into contact with the power semiconductor module package and some other heat poles are exposed to the outside. Accordingly, heat generated from the PCB disposed inside and heat generated from the power semiconductor module package can be absorbed and discharged to the outside, simultaneously, such that a risk of fire can be reduced. In addition, the conductive plate serves as a current line and thus a high current of about hundreds of amperes to thousands of amperes can be used. In addition, slimness and high density of a product can be realized by integrating a PCB and a heat dissipation structure.

Additional and/or other aspects and advantages of the invention will be set forth in part in the description which follows and, in part, will be obvious from the description, or may be learned by practice of the invention.

BRIEF DESCRIPTION OF THE DRAWINGS

The above and other features and advantages will become more apparent by describing in detail exemplary embodiments with reference to the attached drawings in which.

DETAILED DESCRIPTION

Exemplary embodiments will now be described more fully with reference to the accompanying drawings to clarify aspects, other aspects, features and advantages of the inventive concept. The exemplary embodiments may, however, be embodied in many different forms and should not be construed as limited to the exemplary embodiments set forth herein. Rather, the exemplary embodiments are provided so that this disclosure will be thorough and complete, and will fully convey the scope of the application to those of ordinary skill in the art.

Hereinafter, a configuration and an operation of a high-power multi-layer PCB according to the present disclosure will be described in detail with reference to exemplary embodiments and the accompanying drawings.

Figure 1:
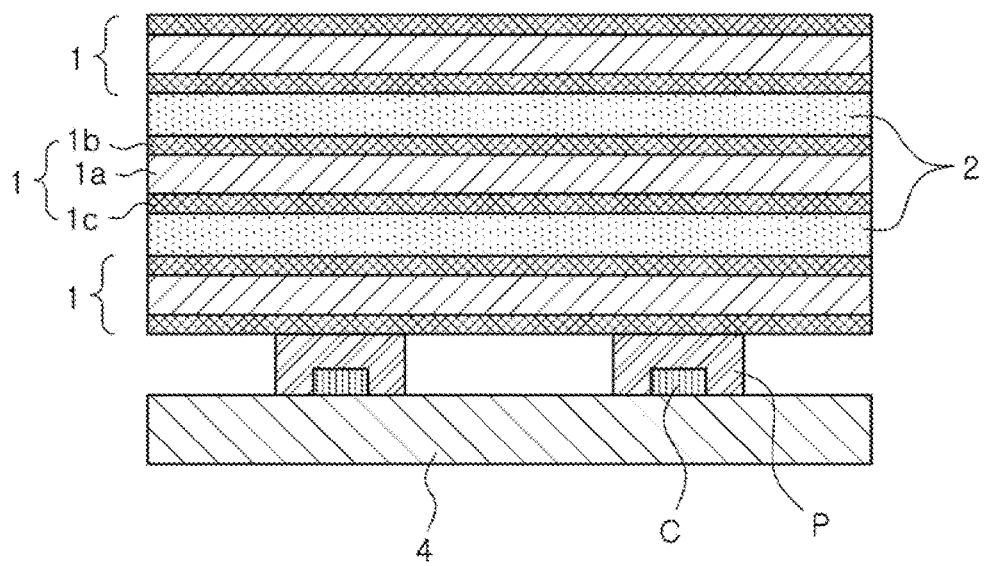
FIG. 1 is a cross section view showing a layered structure of a related-art multi-layer PCB.
Figure 2:
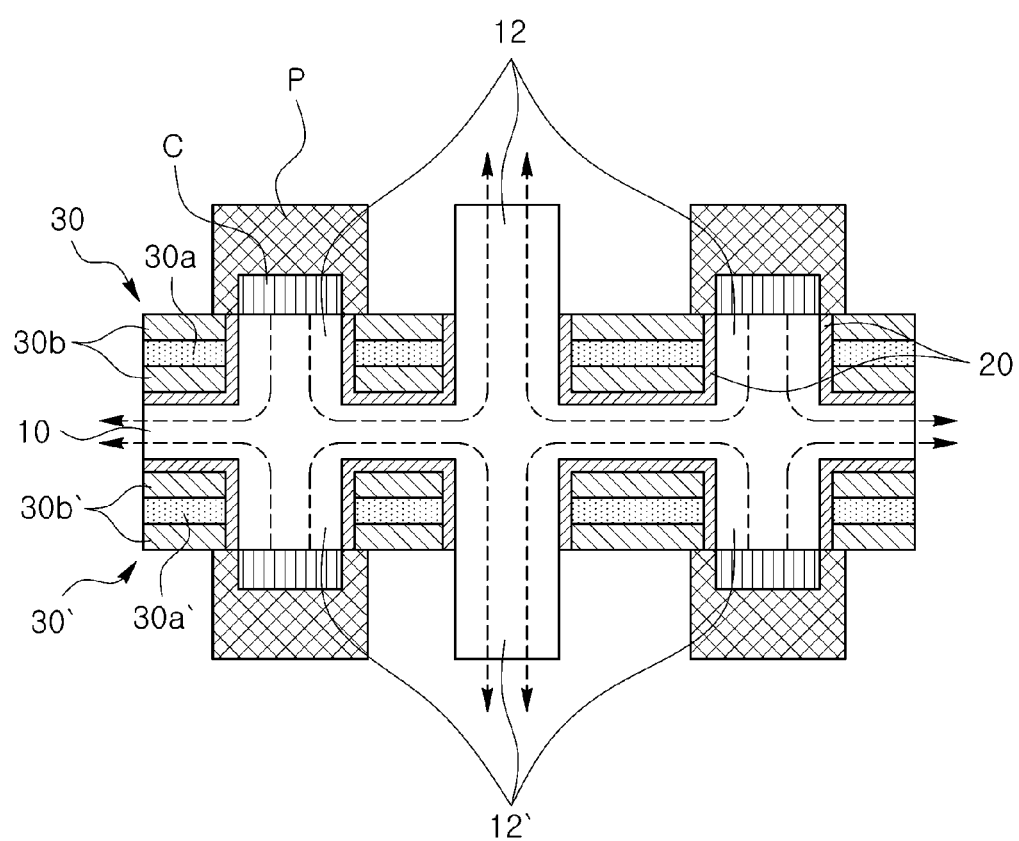
FIG. 2 is a cross section view showing a layered structure of a high-power multi-layer PCB according to a first exemplary embodiment of the present disclosure.
Figure 3:
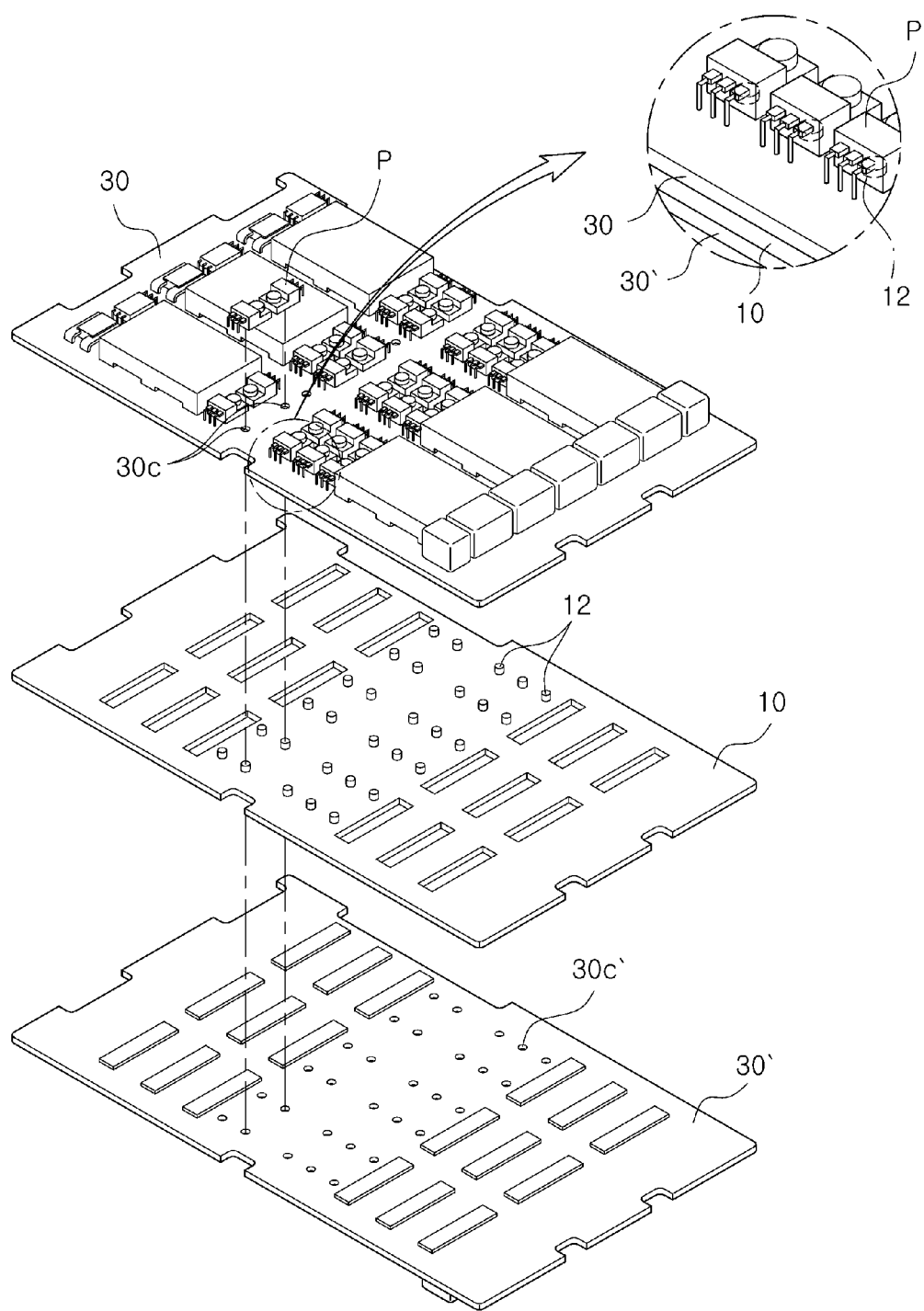
FIG. 3 is an exploded perspective view of the high-power multi-layer PCB according to the first exemplary embodiment of the present disclosure.

FIGS. 2 and 3 illustrate a cross section view and an exploded perspective view, respectively, showing a layered structure of a high-power multi-layer PCB according to a first exemplary embodiment of the present disclosure. As shown in the drawings, the high-power multi-layer PCB according to the first exemplary embodiment of the present disclosure may include a conductive plate 10, an upper PCB 30, and a lower PCB 30'. The upper PCB 30 and the lower PCB 30' are disposed on the top surface and the bottom surface of the conductive plate 10, respectively. An insulation layer 20, made of prepreg, for example, may be attached between the conductive plate 10 and the upper and lower PCBs 30 and 30' to electrically insulate.

The conductive plate 10 includes a plurality of heat poles 12 and 12' protruding from the top surface and/or bottom surface of the conductive plate 10. Some of the plurality of heat poles 12 and 12' may be in contact with a power semiconductor module package P and some other heat poles 12 and 12' may penetrate through the upper and lower PCBs 30 and 30' and be exposed to the outside in order to dissipate heat. The above-described structure will be described in detail below.

The conductive plate 10 is a heat dissipating means for discharging heat generated from the upper and lower PCBs 30 and 30' and the power semiconductor module package P mounted thereon to the outside. Specifically, the conductive plate 10 is thermally in contact with the PCBs 30 and 30' and the core C of the power semiconductor module package P and performs functions of absorbing heat generated from the PCBs 30 and 30' and the power semiconductor module package P and discharging the heat to the outside. To achieve this, the conductive plate 10 may be made of one of materials having high thermal conductivity, such as copper (Cu), aluminum (Al), silicon carbide (SiC), aluminum nitride (AlN), or the like.

The plurality of heat poles 12 and 12' protrude from the surfaces of the conductive plate 10. The heat poles 12 and 12' may be protrusions vertically protruding from the top and bottom surfaces of the conductive plate 10 and formed in a pillar shape having a circular or polygonal cross section. As will be described below, some of the heat poles 12 and

12' (hereinafter, referred to as "first heat poles") may be in contact with the core C of the power semiconductor module package P mounted on the PCBs 30 and 30'. Some other heat poles 12 and 12' (hereinafter, referred to as "second heat poles") may penetrate through the PCBs 30 and 30' and be exposed to the outside. The first heat poles may absorb heat generated from the PCB 30 and 30' and the power semiconductor module package P which are thermally in contact with the first heat poles, may transfer the heat through the conductive plate 10, and may discharge the heat to the outside through the second heat poles. In addition, when the conductive plate 10 is made of a material having electrical conductivity, the conductive plate 10 may serve to transfer a current to the power semiconductor module package P. This will be described below in detail.

Herein, as shown in FIG. 2, the first heat poles in contact with the power semiconductor module package P may be formed to have height corresponding to the height of the bottom surface of the power semiconductor module package P, and the second heat poles exposed to the outside without being in contact with the power semiconductor module package P may extend to have height corresponding to the height of the upper portion of the power semiconductor module package P in order to smoothly dissipate heat.

The upper PCB 30 and the lower PCB 30' are attached to the top surface and the bottom surface of the conductive plate 10, respectively. Each of the upper and lower PCBs 30 and 30' may be a double-sided PCB which includes a substrate 30a made of FR-4, and circuit patterns 30b which are formed on the top and bottom surfaces of the substrate 30a and made of copper. A single double-sided PCB may be attached to each of the top and bottom surfaces of the conductive plate 10, or a plurality of double-sided PCBs may be stacked on the top and bottom surfaces of the conductive plate 10. When the plurality of double-sided PCBs are stacked, an insulation layer (not shown), made of prepreg, for example, may be attached between the double-sided PCBs to electrically insulate.

The upper and lower PCBs 30 and 30' have a plurality of penetrating holes 30c and 30c' formed therethrough, for allowing the heat poles 12 and 12' protruding from the conductive plate 10 to be inserted into the penetrating holes. Through the penetrating holes 30c and 30c', the first heat poles may be in contact with the core C of the power semiconductor module package P mounted outside the PCBs 30 and 30', and the second heat poles may be exposed to the outside of the PCBs 30 and 30' and thereby discharge heat to the outside.

When the PCBs 30 and 30' are in direct contact with the conductive plate 10, a short circuit may be caused. To prevent this, the insulation layer 20 is interposed between the PCBs 30 and 30' and the conductive plate 10. According to an exemplary embodiment, the insulation layer 20 may be made of prepreg.

In the embodiment shown in FIG. 2, the insulation layer 20 may be interposed between the bottom surface of the upper PCB 30 and the top surface of the conductive plate 10, between the inner circumference of the penetrating hole 30c of the upper PCB 30 and the outer surface of the heat pole 12, between the top surface of the lower PCB 30' and the bottom surface of the conductive plate 10, and between the inner circumference of the penetrating hole 30c' of the lower PCB 30' and the outer surface of the heat pole 12'. Since the insulation layer 20 has electrical insulating properties but does not have thermal barrier properties or has low thermal barrier properties, the heat generated from the PCBs 30 and 30' may be transmitted to the conductive plate 10.

Figure 4:
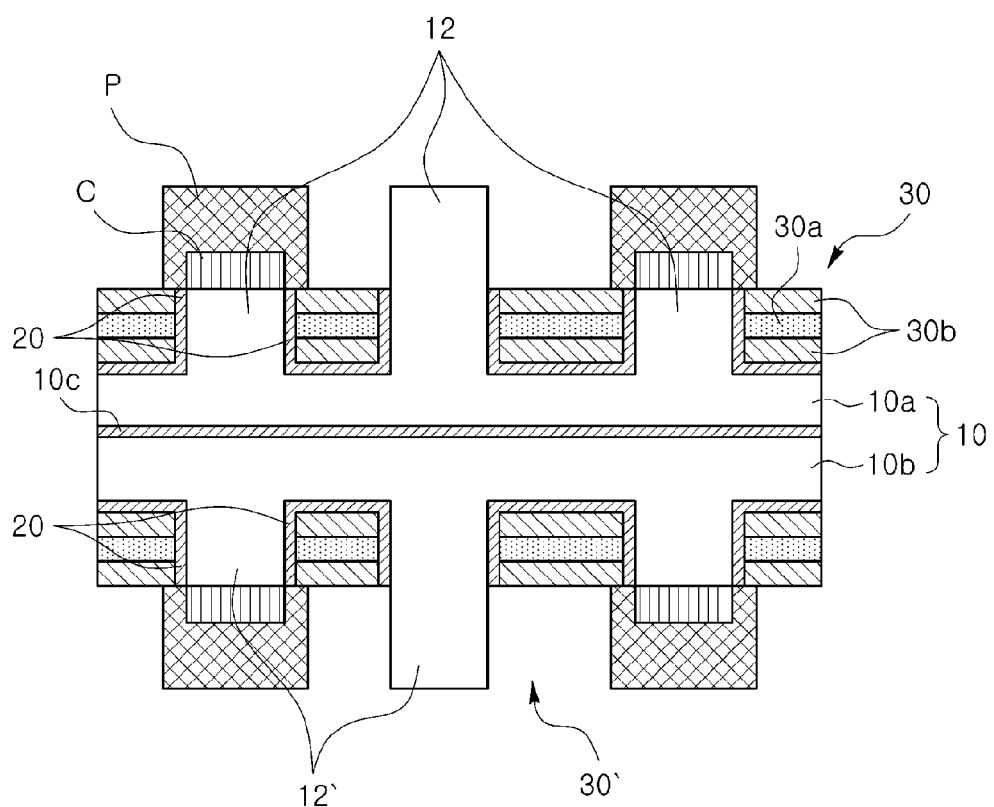
FIG. 4 is a cross section view showing a layered structure of a high-power multi-layer PCB according to a second exemplary embodiment of the present disclosure.

FIG. 4 illustrates a cross section view showing a multi-layered structure of a high-power multi-layer PCB according to a second exemplary embodiment of the present disclosure. The structure illustrated in the second exemplary embodiment is the substantially same as in the first exemplary embodiment, but is characterized in that the conductive plate 10 is divided into an upper plate 10a and a lower plate 10b as shown in FIG. 4. In this case, an insulation layer 10c may be interposed between the upper plate 10a and the lower plate 10b. According to an exemplary embodiment, the insulation layer 10c may be made of prepreg. The other elements in the second exemplary embodiment, such as the upper and lower PCBs 30 and 30', are the same as or similar to those in the first exemplary embodiments, and thus a detailed description thereof is omitted.

As indicated by the arrows in FIG. 2, through the above-described structure, heat generated from the core C of the power semiconductor module package P is absorbed through the first heat poles, is transmitted through the inside of the conductive plate 10, and is then discharged to the outside through the second heat poles of the conductive plate 10 and the exposed portions of both left and right side surfaces. In addition, heat generated from the upper and lower PCBs 30 and 30' is transmitted to the conductive plate 10 and is then discharged to the outside through the second heat poles of the conductive plate 10 and the exposed portions of both left and right side surfaces. Accordingly, fire which may be caused by heat generated by increased current density in the circuit patterns 30b and 30b' can be prevented and thus a high current can be used. Therefore, it is possible to mount and integrate the high-power semiconductor module package P.

The above-described conductive plate 10 may serve as a line through which a current flows. The core C of the power semiconductor module package P is connected to a drain or source terminal of the power semiconductor element mounted in the package. When the conductive plate 10 is formed of a metal plate having electrical conductivity, such as copper or aluminum, a current may be supplied to the power semiconductor module package P which is in contact with the heat poles 12 and 12' through the conductive plate 10. In order to supply the current in this way, the heat poles 12 and 12' exposed to the outside of the PCBs 30 and 30' and the circuit patterns 30b and 30b' of the PCBs 30 and 30' may be electrically connected with each other by welding or other methods, such that the current flowing along the circuit patterns 30b and 30b' of the PCBs 30b and 30b' can be supplied to the power semiconductor module package P through the conductive plate 10. In this case, the conductive plate 10 has thickness of about 0.5 to 3 T, and accordingly, current capacity is 100 times greater than in a normal PCB, such that a high current can be used.

When the conductive plate 10 is made of an insulation material having thermal conductivity but not having electrical conductivity, like silicon carbide or aluminum nitride, the conductive plate 10 only performs a heat dissipating function and does not serve as a current line.

Figure 5:
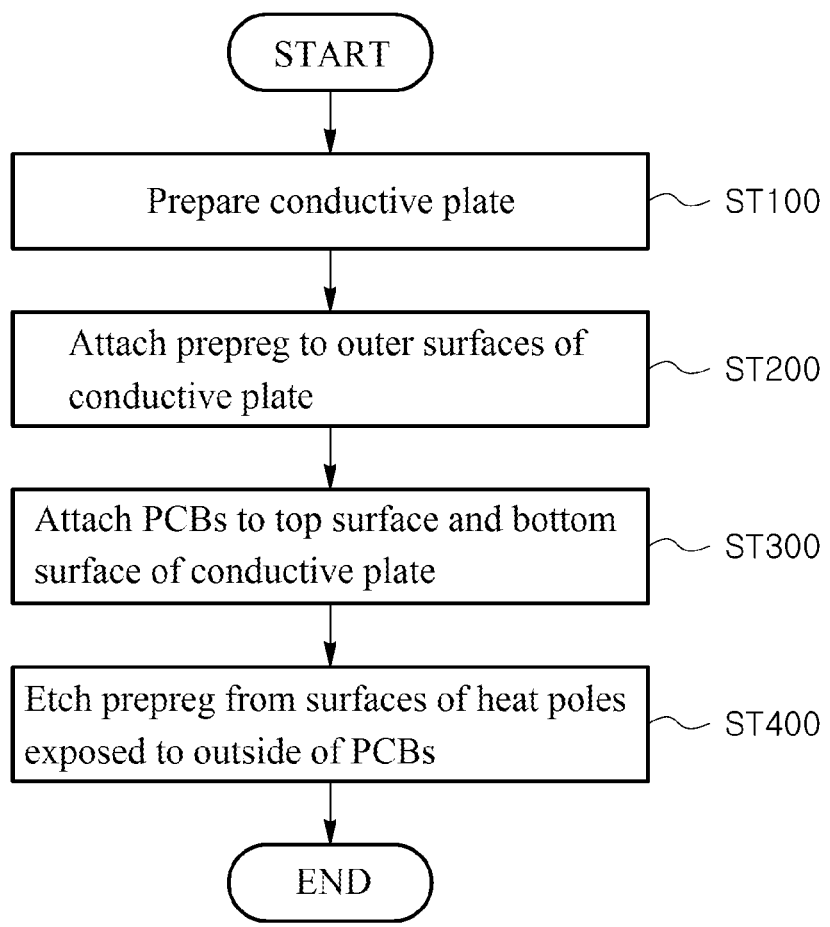
FIG. 5 is a sequence diagram showing a production process of a high-power multi-layer PCB according to the present disclosure.

The structure of the high-power multi-layer PCB according to the present disclosure has been described until now. Hereinafter, a method for producing a high-power multi-layer PCB according to the present disclosure will be described with reference to FIGS. 5 and 6. FIG. 5 illustrates a sequence diagram showing a process of producing a high-power multi-layer PCB according to the present disclosure, and FIG. 6 illustrates a view showing the process of producing the high-power multi-layer PCB according to the present disclosure.

In the first step of the process of producing the high-power multi-layer PCB according to the present disclosure, a conductive plate 10 having a plurality of heat poles 12 and 12' formed on the surfaces thereof is prepared (ST100). The heat poles 12 and 12' may be integrally formed with the conductive plate 10 or may be attached to the surfaces of the conductive plate 10 by brazing or ultrasonic welding. Alternatively, the heat poles 12 and 12' may be integrally formed with the conductive plate 10 by pressing or injection molding.

When the conductive plate 10 is formed as a single plate, the heat poles 12 and 12' may be formed on the top surface and the bottom surface of the conductive plate 10. As described above, the conductive plate 10 may be divided into two plates. In this case, an upper plate 10a having the heat poles 12 formed on the top surface thereof and a lower plate 10b having the heat poles 12' formed on the bottom surface thereof may be individually produced and prepared as shown in view (a) of FIG. 6.

Figure 6:
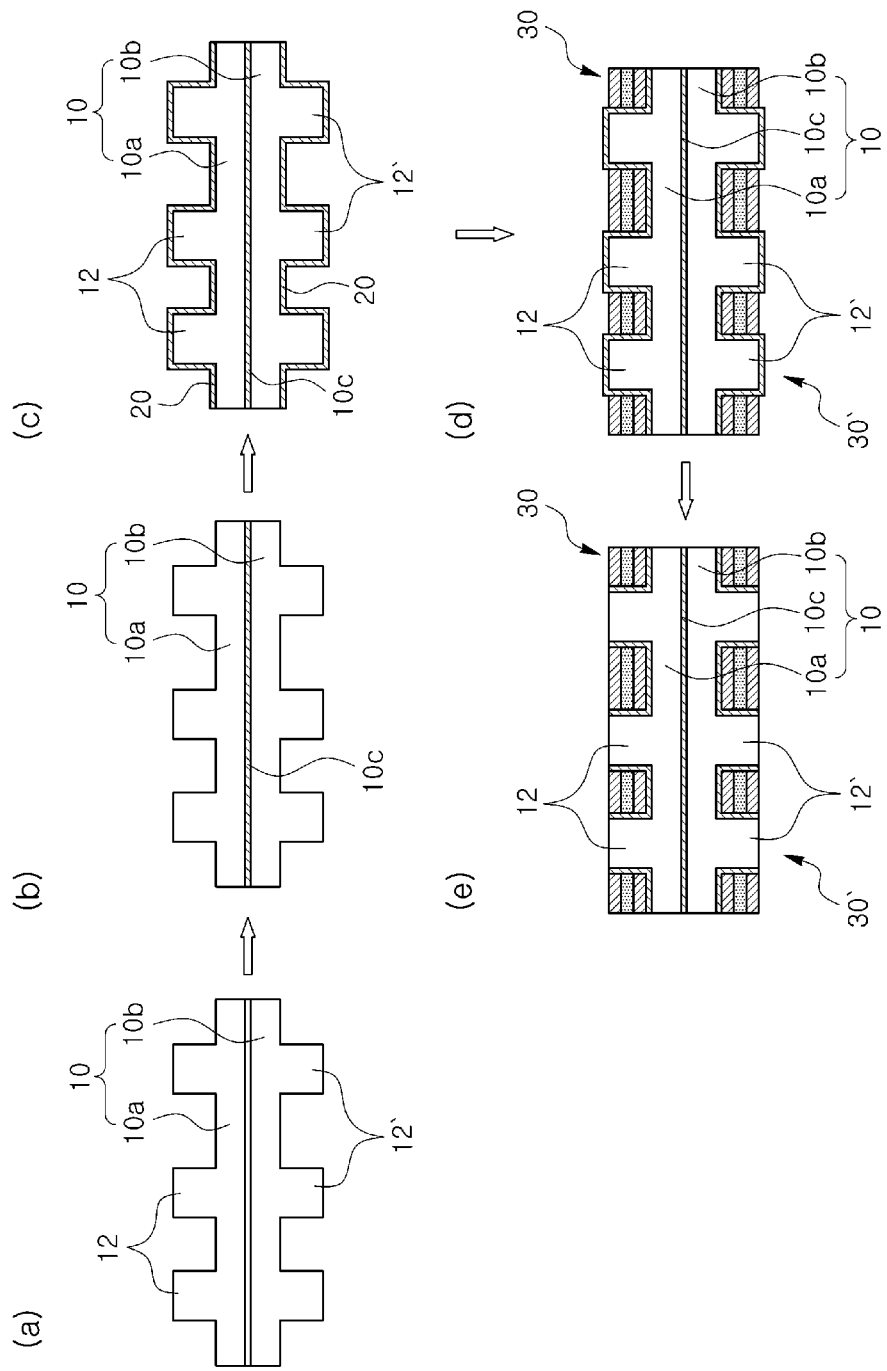
FIG. 6 is a view showing the production process of the high-power multi-layer PCB according to the present disclosure.

Next, as shown in view (b) of FIG. 6, an insulation layer 10c is attached between the upper plate 10a and the lower plate 10b and thereby combines the upper plate 10a and the lower plate 10b with each other.

Next, in the second step, an insulation layer 20 is attached to the outer surface of the conductive plate 10 as shown in view (c) of FIG. 6 (ST200). In this case, the insulation layer 20 may not be attached to both right and left side surfaces of the conductive plate 10 and both the right and left side surfaces of the conductive plate 10 may be exposed to the outside for the sake of heat dissipation.

Next, in the third step, an upper PCB 30 and a lower PCB 30' may be attached to the top surface and the bottom surface of the conductive plate 10, respectively, as shown in view (d) of FIG. 6 (ST300). As described above, at least one of the upper and lower PCBs 30 and 30' may be a double-sided PCB or may be formed by stacking a plurality of double-sided PCBs. In addition, the PCBs 30 and 30' may have a plurality of penetrating holes 30c and 30c' formed therethrough and the heat poles 12 and 12' of the conductive plate 10 may be inserted into the penetrating holes 30c and 30c'.

Next, in the fourth step, as shown in view (e) of FIG. 6, the insulation layer 20 formed on the outer surfaces of the heat poles 12 and 12' inserted into the penetrating holes 30c and 30c' of the PCBs 30 and 30' and exposed to the outside of the PCBs 30 and 30' is removed by etching (ST400), such that the high-power multi-layer PCB according to the present disclosure is completed. Thereafter, a semiconductor is mounted to have a core C brought into contact with some of the heat poles 12 and 12' of the completed high-power multi-layer PCB, and some other heat poles 12 and 12' are exposed to the outside as they are.

While the invention has been shown and described with reference to certain preferred embodiments thereof, it will be understood by those skilled in the art that various changes in form and details may be made therein without departing from the spirit and scope of the invention as defined by the appended claims.

Therefore, the scope of the invention is defined not by the detailed description of the invention but by the appended claims, and all differences within the scope will be construed as being included in the present invention.

What is claimed is:

1. A multi-layer PCB on which a power semiconductor module package is mounted, the multi-layer PCB comprising:

a conductive plate having a plurality of heat poles protruding from at least one of a top surface and a bottom surface thereof;

an upper PCB and a lower PCB which are disposed on the top surface and the bottom surface of the conductive plate respectively, and have a plurality of penetrating holes formed therethrough extending from a top surface to a bottom surface of the upper PCB and the lower PCB to allow the heat poles of the conductive plate to be inserted thereinto; and first insulation layers which are attached between the conductive plate and the upper PCB and between the conductive plate and the lower PCB, respectively.

2. The multi-layer PCB of claim 1, wherein at least one of the plurality of heat poles is in contact with the power semiconductor module package mounted on the upper or lower PCB to absorb heat generated from the power semiconductor module package, and at least another one of the plurality of heat poles is exposed to an outside of the upper or lower PCB to discharge heat to the outside.

3. The multi-layer PCB of claim 2, wherein the heat poles in contact with the power semiconductor module package are formed to have height corresponding to height of a bottom surface of the power semiconductor module package, and the heat poles exposed to the outside extend to have height corresponding to height of an upper portion of the power semiconductor module package.

4. The multi-layer PCB of claim 1, wherein the conductive plate is a thermally conductive plate which is made of a material selected from the group consisting of copper (Cu), aluminum (Al), silicon carbide (SiC), and aluminum nitride (AlN).

5. The multi-layer PCB of claim 1, wherein each of the upper and lower PCBs is a double-sided PCB comprising a substrate and circuit patterns formed on both surfaces of the substrate.

6. The multi-layer PCB of claim 5, wherein at least one of the upper and lower PCBs is formed by stacking a plurality of PCBs, and a second insulation layer is interposed between the plurality of PCBs.

7. The multi-layer PCB of claim 1, wherein the conductive plate comprises:

an upper plate having the heat poles formed on a top surface thereof, a lower plate having the heat poles formed on a bottom surface thereof, and a third insulation layer attached between the upper plate and the lower plate.

8. A method for producing a multi-layer PCB, the method comprising:

a first step of preparing a conductive plate having a plurality of heat poles protruding from a top surface and a bottom surface thereof;

a second step of attaching a first insulation layer to outer surfaces of the conductive plate;

a third step of attaching an upper PCB and a lower PCB to the top surface and the bottom surface of the conductive plate, respectively, and placing the upper PCB and the lower PCB to allow the heat poles of the conductive plate to be inserted into penetrating holes formed on the upper and lower PCBs and extending from a top surface to a bottom surface of the upper PCB and the lower PCB; and a fourth step of removing the first insulation layer from the outer surfaces of the heat poles inserted through the upper and lower PCBs and exposed to an outside of the upper and lower PCBs.

9. The method of claim 8, wherein a power semiconductor module package is mounted on at least one of the upper and lower PCBs and is placed to have a core of the power semiconductor module package brought into contact with some of the heat poles, and some other heat poles are exposed to the outside.

10. The method of claim 8, wherein the first step comprises:
   individually producing and preparing an upper plate having the heat poles formed on a top surface thereof and a lower plate having the heat poles formed on a bottom surface thereof; and
   attaching a second insulation layer between the upper plate and the lower plate to combine the upper plate and the lower plate with each other.

11. The method of claim 8, wherein the second step comprises exposing both right and left side surfaces of the conductive plate to the outside without attaching the first insulation layer to both the right and left side surfaces of the conductive plate, for the sake of heat dissipation.

* * * * *